(12) United States Patent
Akiba et al.

(10) Patent No.: US 9,129,976 B2
(45) Date of Patent: Sep. 8, 2015

(54) METHOD OF MANUFACTURING SEMICONDUCTOR APPARATUS AND SEMICONDUCTOR APPARATUS

(71) Applicant: SHIN-ETSU CHEMICAL CO., LTD., Tokyo (JP)

(72) Inventors: Hideki Akiba, Annaka (JP); Toshio Shiobara, Annaka (JP); Susumu Sekiguchi, Takasaki (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 98 days.

(21) Appl. No.: 13/964,210

(22) Filed: Aug. 12, 2013

(65) Prior Publication Data

US 2014/0091483 A1    Apr. 3, 2014

(30) Foreign Application Priority Data

Oct. 3, 2012   (JP) .................... 2012-221590

(51) Int. Cl.
*H01L 21/00* (2006.01)
*H01L 21/56* (2006.01)
*H01L 23/28* (2006.01)
*H01L 23/31* (2006.01)
*H01L 23/00* (2006.01)

(52) U.S. Cl.
CPC .............. *H01L 21/56* (2013.01); *H01L 21/561* (2013.01); *H01L 23/28* (2013.01); *H01L 23/3128* (2013.01); *H01L 24/97* (2013.01); *H01L 24/45* (2013.01); *H01L 24/48* (2013.01); *H01L 2224/45144* (2013.01); *H01L 2224/48091* (2013.01); *H01L 2224/48227* (2013.01); *H01L 2924/10253* (2013.01); *H01L 2924/15311* (2013.01)

(58) Field of Classification Search
CPC .......... H01L 21/56; H01L 23/28; H01L 24/97
See application file for complete search history.

(56) References Cited

U.S. PATENT DOCUMENTS

| 6,538,317 | B1 | 3/2003 | Miyata |
| 2007/0045791 | A1* | 3/2007 | Saeki ............................ 257/668 |
| 2013/0241087 | A1* | 9/2013 | Shiobara et al. .............. 257/791 |

FOREIGN PATENT DOCUMENTS

| JP | A-2001-44324 | 2/2001 |
| JP | A-2003-213087 | 7/2003 |
| JP | A-2009-32842 | 2/2009 |

OTHER PUBLICATIONS

Jun. 18, 2015 Taiwanese Office Action issued in Taiwanese Application No. 102135870.

* cited by examiner

*Primary Examiner* — Daniel Whalen
(74) *Attorney, Agent, or Firm* — Oliff PLC

(57) ABSTRACT

A method of manufacturing a semiconductor apparatus includes: a charging step of charging the thermosetting resin in excess of an amount necessary for forming the sealing layer to fill the inside of the first cavity with the thermosetting resin and discharging an excess of the thermosetting resin from the first cavity; an integrating step of integrating the substrate on which the semiconductor device is mounted, the substrate on which no semiconductor device is mounted and the sealing layer by molding the thermosetting resin while pressurizing the upper mold and the lower mold; and a dicing step of extracting the integrated substrates from the molding mold and dicing the integrated substrates to obtain an individual semiconductor apparatus.

13 Claims, 2 Drawing Sheets

METHOD OF MANUFACTURING SEMICONDUCTOR APPARATUS AND SEMICONDUCTOR APPARATUS

BACKGROUND OF THE INVENTION

1. Field of the Invention

The present invention relates to a method of manufacturing a semiconductor apparatus with a forming mold, and a semiconductor apparatus manufactured thereby.

2. Description of the Related Art

Various methods have been conventionally proposed and investigated for a sealing method on a wafer level, and a method for molding a thermosetting epoxy resin on one side of an organic substrate on which semiconductor devices are mounted in a matrix pattern (See Patent Documents 1 to 3).

In producing semiconductor apparatuses by the above-mentioned methods, for a small substrate, it is possible to control the warp of a substrate after sealing by adjusting a linear expansion coefficient of the applicable epoxy resin.

It is possible even at present to conduct sealing and molding without serious problems, in the case of using a substrate such as a small diameter wafer on the order of 8 inches (200 mm) or an organic substrate in a small size. However, for wafers larger than 8-inch diameter or large organic substrates, the epoxy resin after sealing produces large contraction stress; a wafer or an organic substrate having a molded resin on its one side are broken or greatly warped, thereby disabling production of a semiconductor apparatus.

To solve the above problem caused by large wafers and metal substrates, it is necessary to charge a filler into the resin up to a level of 95 wt %, and to lower the elasticity of the resin to thereby reduce its contraction stress upon curing.

CITATION LIST

Patent Literature

[Patent Document 1] Japanese Patent Application Publication No. 2001-044324
[Patent Document 2] Japanese Patent Application Publication No. 2003-213087
[Patent Document 3] Japanese Patent Application Publication No. 2009-032842

SUMMARY OF THE INVENTION

Unfortunately, such thermosetting resins, each containing a filler charged up to a level of 95 wt % and capable of being sufficiently molded, have been never produced. Further, lowering the elasticity of the resin down to a level to which the warp is not produced rather causes a problem of deterioration of heat resistance and wet resistance of a semiconductor apparatus.

When a substrate on which a plurality of semiconductor devices are mounted is sealed with a resin to form a sealing layer, and the devices include a failed semiconductor device, the substrate is sealed after the failed device is removed. In this case, the amount of a resin necessary to form the sealing layer increases by an amount corresponding to the volume of the removed failed device. It is therefore necessary to control the volume of a resin necessary to form a sealing layer.

However, calculating every time the amount of a necessary resin for sealing to adjust a charging amount is very complicated, increasing a process time; a fault occurs, such that voids are generated in the sealing layer because of lack of the charging amount.

The present invention was accomplished in view of the above-described problems. It is an object of the present invention to provide a method of manufacturing a semiconductor apparatus, which suppresses a warp during manufacture of the semiconductor apparatus and enables a semiconductor apparatus having excellent heat resistance and wet resistance to be manufactured without performing a conventional countermeasure against a warp with a filler and adjusting during forming a sealed layer the amount of charging a resin in accordance with the number of failed devices.

In order to achieve the above object, the present invention provides a method of manufacturing a semiconductor apparatus with a forming mold having an upper mold and a lower mold comprising: a preparing step of preparing the forming mold having a first cavity for integrating a substrate on which a semiconductor device is mounted, a substrate on which no semiconductor device is mounted, and a sealing layer to be formed of a thermosetting resin between the substrates; an arranging step of heating the first cavity to a temperature ranging from a room temperature to 200° C., disposing the substrate on which the semiconductor device is mounted on one of the upper mold and the lower mold of the forming mold, and disposing the substrate on which no semiconductor device is mounted on the other of the upper mold and the lower mold; a charging step of charging the thermosetting resin in excess of an amount necessary for forming the sealing layer to fill the inside of the first cavity with the thermosetting resin and discharging an excess of the thermosetting resin from the first cavity; an integrating step of integrating the substrate on which the semiconductor device is mounted, the substrate on which no semiconductor device is mounted and the sealing layer by molding the thermosetting resin while pressurizing the upper mold and the lower mold; and a dicing step of extracting the integrated substrates from the molding mold and dicing the integrated substrates to obtain an individual semiconductor apparatus.

In such a method of manufacturing a semiconductor apparatus, even when a failed semiconductor device is removed, it is unnecessary to adjust the amount of a resin to be charged each time, and without generating voids, a substrate and a sealing layer can be surely integrated. Further, even when a large substrate is sealed, the sealed substrate can be suppressed from warping or cracking. This method also enables collective sealing on a wafer level.

In the preparing step, the forming mold further having a second cavity that is connected with the first cavity via a runner is prepared, and, in the charging step, the excess of the thermosetting resin is preferably discharged into the second cavity.

In this manner, the excessive thermosetting resin can be readily discharged from the first cavity while the inside of the first cavity is filled with the resin.

In the charging step, the thermosetting resin is preferably charged in excess of the necessary amount to form the sealing layer by 0.1 to 70 volume percent of the necessary amount to form the sealing layer.

When the thermosetting resin is charged in excess of the amount necessary by 0.1 volume percent as above, the inside of the first cavity can be surely filled, and when the thermosetting resin is charged in excess of the amount necessary by 70 volume percent as above, the excessive thermosetting resin can be suppressed from increasing and thereby the cost can be suppressed from increasing.

In the integrating step, the inside of the first cavity or the inside of the second cavity is preferably pressurized to mold the thermosetting resin.

In this manner, voids in the sealing layer can be reduced and the semiconductor apparatus produced can be improved in performance.

At this time, the inside of the first cavity can be pressurized by pressing air or an inert gas into the second cavity. In this case, air or an inert gas can be pressed into the second cavity by an external pump or a cylinder.

Alternatively, the inside of the first cavity can be pressurized by injecting a liquefied thermosetting resin, a liquefied thermoplastic resin, or a liquid into the second cavity. In this case, the liquefied thermosetting resin, the liquefied thermoplastic resin, or a liquid can be injected into the second cavity by a cylinder.

When conducted as above, the first cavity can be readily pressurized.

It is also possible that in the arranging step, the second cavity is heated to a temperature higher than a temperature of the first cavity, and in the charging step, the excess of the thermosetting resin discharged into the second cavity is cured before curing the thermosetting resin inside the first cavity. In this case, the second cavity can be heated to a temperature in the range of 100 to 250° C.

In this manner, regardless of the volume of the first and second cavities and the amount of the thermosetting resin being charged, surely the inside of the first cavity can be hermetically sealed to integrate the substrate and the sealing layer.

In the integrating step, the atmosphere inside the first cavity can be depressurized to mold the thermosetting resin. In this case, the atmosphere inside the first cavity can be depressurized to a degree of vacuum of 0.01333 to 13.33 KPa.

In this manner, voids in the sealing layer can be more effectively reduced.

In the method of manufacturing a semiconductor apparatus of the present invention, the thermosetting resin can be molded by compression molding or by transfer molding.

As the thermosetting resin, any one of an epoxy resin, a silicone resin, and a silicone/epoxy hybrid resin may be used.

When such a resin is used, a semiconductor apparatus having excellent heat resistance and wet resistance can be manufactured.

Further, the present invention provides a semiconductor apparatus manufactured according to the method of manufacturing a semiconductor apparatus.

Such a semiconductor apparatus has, in addition to excellent heat resistance and wet resistance, less residual strain as a result of suppressing a warp.

According to a method of manufacturing a semiconductor apparatus of the present invention, a thermosetting resin is charged in excess of an amount necessary for forming a sealing layer to fill the inside of the first cavity and an excess of the thermosetting resin is discharged from the first cavity; therefore, even when a failed semiconductor device is removed and adjusting the amount of a resin to be charged in accordance with the number of failed devices is excluded during forming the sealing layer, a substrate and the sealing layer can be surely integrated without generating voids. Further, since a substrate on which a semiconductor device is mounted, a substrate on which no semiconductor device is mounted, and the sealing layer of a thermosetting resin formed between these substrates are integrated, even when a large substrate is sealed, the sealed substrate can be suppressed from warping or breaking. This method also enables collective sealing on a wafer level.

DETAILED DESCRIPTION OF THE PREFERRED EMBODIMENTS

Hereinafter, embodiments of the present invention will be described. However, the present invention is not limited thereto.

As described above, desired is a method of manufacturing a semiconductor apparatus, enabling a substrate and a sealing layer to be integrated without every time calculating a necessary resin amount and adjusting a charging amount, even when a failed semiconductor device is removed in sealing a resin.

The present inventors studied hard to achieve the objects and found the followings, thereby bringing the present invention to completion. That is, the substrate and the sealing layer can be surely integrated without adjusting a charging amount of the resin in such a way that before integrating a substrate and a sealing layer, a thermosetting resin of an amount in excess than an amount necessary to form a sealing layer is charged in a first cavity to fill the inside of the first cavity; an excessive thermosetting resin is discharged outside the first cavity.

Firstly, a semiconductor apparatus of the present invention manufactured according to a method of manufacturing a semiconductor apparatus of the present invention will be described.

Figure 2:
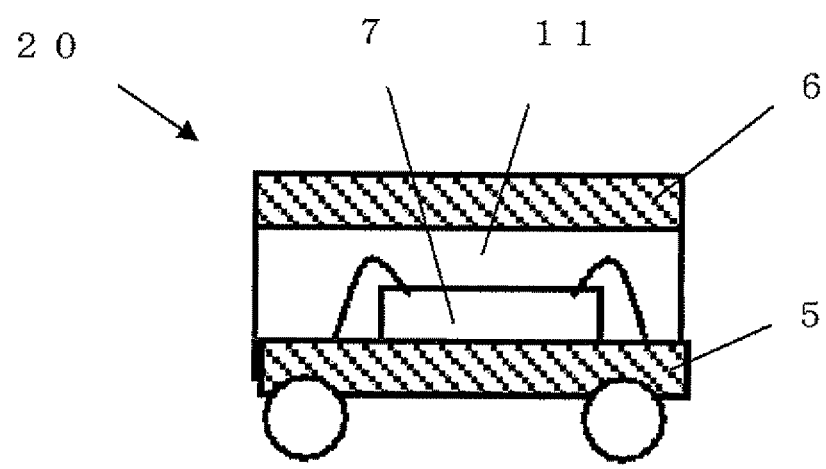
FIG. 2 is a schematic diagram showing a semiconductor apparatus of the present invention.

As shown in FIG. 2, a semiconductor apparatus 20 of the present invention is mainly constituted of semiconductor devices 7, a substrate 5 on which semiconductor devices are mounted, a substrate 6 on which no semiconductor device is mounted, and a sealing layer 11 of a thermosetting resin. The semiconductor devices 7 are mounted on the substrate 5 on which the semiconductor devices are mounted. The sealing layer 11 for sealing the semiconductor devices 7 is formed between the substrate 5 on which the semiconductor devices are mounted and the substrate 6 on which no semiconductor device is mounted. Although the semiconductor apparatus 20 has a thickness depending on the thickness of semiconductor devices 7 to be mounted thereon, the apparatus desirably has a thickness of 1 mm or less because household electric appliances can be downsized by using the semiconductor apparatus.

Figure 1:
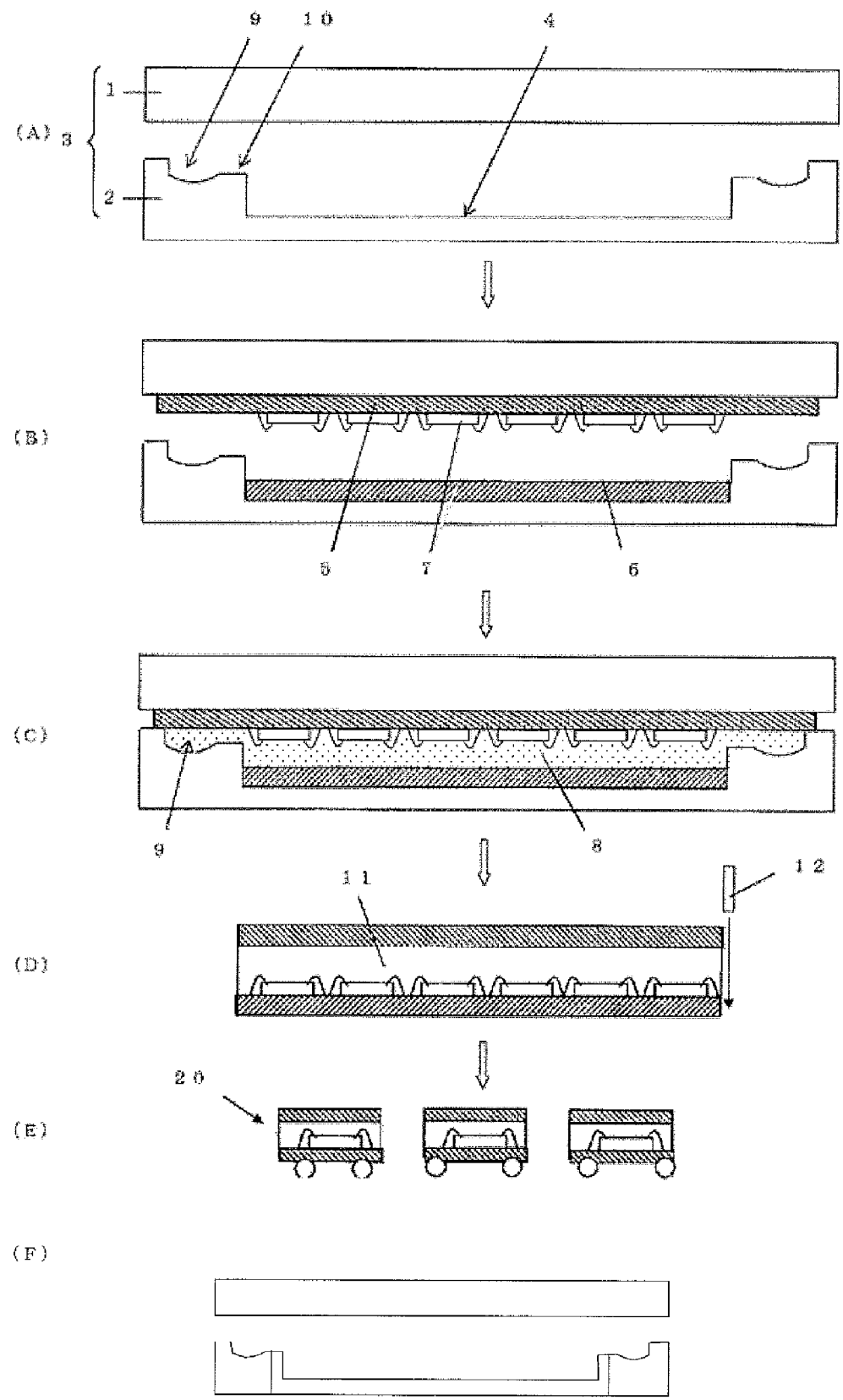
FIG. 1 is a flowchart of a method of manufacturing a semiconductor apparatus of the present invention.

A semiconductor apparatus of the present invention can be manufactured by a method of manufacturing a semiconductor apparatus of the present invention, which will be described below in detail. In FIG. 1, a flowchart of a method of manufacturing a semiconductor apparatus of the present invention is shown.

[(A) Preparing Step]

In the preparing step, a forming mold 3 having a first cavity 4 for integrating a substrate on which semiconductor devices are mounted, a substrate on which no semiconductor device is mounted, and a sealing layer, formed between these substrates, of a thermosetting resin is prepared. The forming mold 3 includes an upper mold 1 and a lower mold 2.

The forming mold may be such a mold having a movable mechanism in a cavity part as used in compression molding, or such a mold having a passage for pressure injecting of a resin after mold clamping as used in transfer molding.

The size and shape of the first cavity 4 is not particularly limited; the first cavity can be structured appropriately in accordance with a semiconductor apparatus being manufactured. Further, the first cavity 4 may be formed in either of the upper mold 1 or the lower mold 2, or may be formed in both molds.

The forming mold 3 being prepared here may be include a second cavity 9 connected via a runner 10 with the first cavity 4.

[(B) Arranging Step]

In the arranging step, the first cavity is heated to a temperature ranging from room temperature to 200° C., the substrate 5 on which the semiconductor devices are mounted is disposed on one of the upper mold 1 and the lower mold 2 of the forming mold 3, and the substrate 6 on which no semiconductor device is mounted is disposed on the other mold of the upper mold 1 and the lower mold 2. The arranging manner is not particularly limited and may be performed by attaching by suction each substrate on the corresponding surface of the heated upper mold 1 and lower mold 2.

Here, the invention is not limited by a way of which of the upper and lower molds the substrate 5 on which the semiconductor devices are mounted and the substrate 6 on which no semiconductor device is mounted are disposed on. In FIG. 1B, the substrate 5 on which the semiconductor devices are mounted is disposed on the upper mold 1 is shown by way of example.

The substrate 5 on which the semiconductor devices are mounted and/or substrate 6 on which no semiconductor device is mounted may be a rectangular substrate or a disc-shaped wafer. As the substrates 5 and 6, an inorganic substrate, a metal substrate, or an organic resin substrate may be used. In the substrate 5 on which the semiconductor devices are mounted, semiconductor devices 7 are mounted on or formed in such a substrate. In the substrate 6 on which no semiconductor device is mounted, no semiconductor device is mounted on or formed in such a substrate. Particularly, in the case of using an organic resin substrate, one containing fibers may be used from a standpoint of controlling an expansion coefficient as described later.

Examples of the inorganic substrate include a ceramic substrate, and a silicon wafer, and representative examples of the metal substrate include a copper or aluminum substrate having an insulated surface. Examples of the organic resin substrate include a BT (bismaleimido triazine) resin substrate, a glass epoxy substrate, and an FRP (fiberglass reinforced plastic) substrate.

Examples of fibers utilizable in an organic resin substrate containing fibers, include: inorganic fibers such as a carbon fiber, a glass fiber, a quartz glass fiber, a metal fiber; organic fibers such as an aromatic polyamide fiber, a polyimide fiber, a polyamide imide fiber, and a silicon carbide fiber, a titanium carbide fiber, a boron fiber, and an alumina fiber. Examples of the organic resin substrate containing fibers include an epoxy resin substrate, a BT resin substrate, and a silicone resin substrate, each reinforced with these fibers. It is possible to use any types of substrates other than these types of resin substrates depending on product properties, as long as an electric insulation property is maintained. Most preferable organic resin substrates containing fibers are those each reinforced with glass fibers, quartz fibers, carbon fibers, or the like. Among them, those using glass fibers, or quartz glass fibers exhibiting a higher electric insulation property are particularly preferable.

Examples of the fibers for reinforcement as described above include those in sheet shapes such as a roving having long fiber filaments aligned in one direction, a cloth, and a nonwoven fabric, and a chopped strand mat. They are not limited in particular, insofar as capable of forming a laminated body.

The metal substrate, inorganic substrate, or organic resin substrate preferably have a thickness of 20 μm to 1 mm, more preferably 30 μm to 500 μm, and most preferably 30 μm to 200 μm. For a thicknesses of 20 μm or greater, deformation of the substrate due to excessive thinness can be prevented, and break of the substrate upon handling can be suppressed in the case of using an inorganic substrate. For a thicknesses of 1 mm or less, a semiconductor apparatus can be prevented from being excessively thickened.

It is preferable that the substrate on which the semiconductor devices are mounted and the substrate on which no semiconductor device is mounted are similar in physical properties and it is particularly preferable that both substrates have substantially the same linear expansion coefficients, or a linear expansion coefficient of 25 ppm/° C. or less, particularly 15 ppm/° C. or less. Particularly, when both substrates possess similar physical properties, the warp of a semiconductor apparatus after sealed by molding the thermosetting resin can be suppressed.

Further, in the case of using organic resin substrates as the substrate on which the semiconductor devices are mounted and substrate on which no semiconductor device is mounted, it is desirable, from a standpoint of reducing the warp of a semiconductor apparatus to be manufactured, that at least one of the organic resin substrates, more desirably both substrates, have a linear expansion coefficient between 3 and 25 ppm/° C. at a temperature in a range from a room temperature to 200° C. It is noted that the room temperature means 25° C.±10° C. in the present invention (the same rule applies correspondingly to the following).

Moreover, in the case of using an inorganic substrate such as a silicon wafer, or an organic resin substrate as the substrate on which the semiconductor devices are mounted, the inorganic substrate or organic resin substrate with semiconductor devices desirably has an expansion coefficient between 3 and 15 ppm/° C. in an X-Y direction at a temperature in a range from a room temperature to 200° C.

Also, in the case of using an organic resin substrate as the substrate on which no semiconductor device is mounted, the organic resin substrate desirably has an expansion coefficient between 5 and 25 ppm/° C. in an X-Y direction at a temperature in a range from a room temperature to 200° C. The organic resin substrate having an expansion coefficient in such a range has a small difference in expansion coefficient from that of the substrate on which the semiconductor devices are mounted, thereby enabling suppression of the warp of a semiconductor apparatus being manufactured. It is noted that the organic resin substrate more desirably has an expansion coefficient between 5 and 20 ppm/° C., and most desirably between 5 and 15 ppm/° C.

The substrates are each in a size of about 20 mm to 500 mm in width and about 100 to 500 mm in length, from standpoints of productivity, and handling easiness. Further, a circular substrate having a diameter of about 50 to 400 mm is desirable from the viewpoint of productivity and handling easiness. Substrates in such a size are easy to dispose semiconductor devices thereon, and to be connected with gold wires by a wire bonder.

[(C) Resin Charging Step]

In the charging step, the thermosetting resin 8 is charged in excess of an amount necessary for forming the sealing layer to fill the inside of the first cavity 4 and an excess of the thermosetting resin 8 is discharged from the first cavity 4.

When the thermosetting resin 8 is charged like this, even when failed semiconductor devices are removed from the substrate on which the semiconductor devices are mounted, it is unnecessary to calculate an amount of the thermosetting resin necessary in accordance with the number of the removed semiconductor devices to adjust a charging amount, unlike a conventional method.

Here, an amount of the resin necessary for forming the sealing layer can be set to, for example, an amount required when the substrate has no semiconductor device. In this manner, the sealing layer can be surely formed without forming an uncharged void part regardless of the number of the number of failed semiconductor devices.

As shown in FIG. 1, in the preparing step (A) for example, the forming mold 3 further having the second cavity 9 is prepared, and, in the charging step (C), an excess of the thermosetting resin 8 can be discharged into the second cavity 9.

The size and shape of the second cavity 9 and the liner 10 are not particularly limited and can be structured appropriately in accordance with the size and shape of the forming mold used and an amount of the thermosetting resin being charged. Further, the second cavity 9 may be formed in either of the upper mold 1 or the lower mold 2, or in both molds.

For example, a sum total of capacities of the first cavity 4 and the second cavity 9 may be made larger than a volume of the thermosetting resin 8 being charged. When thus configured, it can be avoided that an excess of the thermosetting resin 8 overflows from the forming mold and further to form a burr.

In this case, in order to surely establish a hermetically sealed state in the first cavity 4 when the thermosetting resin is molded in the integrating step that is a back end step, for example, in the arranging step (B), a temperature of the second cavity 9 is elevated to a temperature higher than a temperature of the first cavity 4, and, in the charging step (C), an excess of the thermosetting resin discharged into the second cavity 9 can be cured in advance to the thermosetting resin inside the first cavity 4. Here, a temperature inside of the second cavity 9 can be set in the range of 100 to 250° C.

Alternatively, as will be described below, while pressurizing the inside of the first cavity 4 and the second cavity 9, the thermosetting resin may be molded.

Further, when the thermosetting resin is charged in the first cavity 4 in the resin charging step, 0.1 to 70% by volume more than an amount necessary to form a sealing layer is desirably charged.

When the thermosetting resin is charged in excess by 0.1% by volume than a necessary amount, the inside of the first cavity can be surely filled, and when the thermosetting resin is charged in excess by 70% by volume, an excess of the thermosetting resin can be surely suppressed from increasing to suppress the cost from increasing.

[(D) Integrating Step]

In the integrating step, while the upper mold 1 and the lower mold 2 are pressurized, the thermosetting resin 8 is molded to integrate the substrate 5 on which the semiconductor devices are mounted, the substrate 6 on which no semiconductor device is mounted and the sealing layer 11. In this way, the two substrates are used at the front and back surfaces of semiconductor devices to seal the gap between the substrates by molding the thermosetting resin; a semiconductor apparatus which is substantially free of its warp and excellent in heat resistance and moisture resistance can be produced. The gap between the integrated substrate on which the semiconductor devices are mounted and the substrate on which no semiconductor device is mounted, that is, the height of the sealing layer 11, is preferably 20 to 1,000 μm.

In the integrating step, it is possible to use compression molding, transfer molding, or the like, which are typically used. Specifically, the integrating step may be configured to: place the thermosetting resin in a liquid state at a room temperature or in a heated condition onto the substrate arranged on the lower mold half; and press the upper mold half and the lower mold half toward each other to perform compression molding of the thermosetting resin. Alternatively, in the integrating step, the upper mold half and the lower mold half are clumped together; and the thermosetting resin in a liquid state at a room temperature or in a heated condition is poured into a gap between the substrates arranged on the upper mold half and lower mold half to perform transfer molding of the thermosetting resin.

In the case of the compression molding, in the charging step (C), after charging the thermosetting resin 8, heated upper and lower molds are mold clamped under pressure to fill the inside of the first cavity 4 with the liquefied thermosetting resin 8, an excess of the thermosetting resin 8 is discharged from the first cavity 4, and as it is, the thermosetting resin 8 is heat cured.

In the case of the transfer molding, in the arranging step (B), the substrates are each attached by suction onto surfaces of the heated upper and lower molds, the upper and lower molds are clamped together, and in the charging step (C), the thermosetting resin 8 that liquefies at a room temperature or in a heated condition is pressurized and poured into the gap between the substrates and the resin is cured to integrate the upper and lower substrates together. The number of gates and structures for flowing the resin into the gap may be designed in accordance with the flowability, and curing characteristic of the resin, because the resin is required to be pressurizedly poured into a narrow and large gap.

Desirable curing and molding conditions include a temperature between 80° C. and 200° C., a time of 1 to 5 minutes, and a pressure between 5 and 150 Kg/cm$^2$.

In the integrating step, the thermosetting resin can be molded by pressurizing the inside of the first cavity 4 or the second cavity 9. When thus conducting, a filling property into a gap can be improved and generation of voids in the sealing layer 11 can be reduced.

As a specific method, by using an external pump or a cylinder for example, air or an inert gas is pressed into the second cavity to be able to pressurize the inside of the first cavity. Alternatively, by using a cylinder for example, when a liquefied thermosetting resin, a liquefied thermoplastic resin, or a liquid is injected in the second cavity, the inside of the first cavity can be pressurized.

Alternatively, in order to improve the filling property into a gap, by depressurizing an atmosphere in the first cavity, the thermosetting resin can be molded as well. As a degree of decompression, it is better to depressurize as near as possible to vacuum. For example, the degree of vacuum can be set to 0.01333 to 13.33 KPa (0.1 to 100 Torr).

The thermosetting resin 8 used in the integrating step may be prepared in a form of composition containing another component. Preferably used as the thermosetting resin is: an epoxy resin in a liquid state at a room temperature that is commonly used for sealing semiconductor devices; and a solid epoxy resin, a silicone resin, or a silicone/epoxy hybrid resin comprising an epoxy resin and silicone resin, which are each typically liquefied by heating to 100° C. or lower. When the solid thermosetting resin that is liquefied under heating is used, contamination of a line generated when a powdery thermosetting resin is used can be avoided.

Examples usable as the aforementioned epoxy resin include those known epoxy resins which are liquid or solid at a room temperature, including: bisphenol A type epoxy resins; bisphenol F type epoxy resins; biphenol type epoxy resins such as a 3,3',5,5'-tetramethyl-4,4'-biphenol type epoxy resin, or 4,4'-biphenol type epoxy resin; epoxy resins obtained by hydrogenating an aromatic ring (s) of a phenol novolak type epoxy resin, cresol novolak type epoxy resin, bisphenol A novolak type epoxy resin, naphthalenediol type epoxy resin, trisphenylol methane type epoxy resin, tetrakisphenylol ethane type epoxy resin, or phenol-dicyclopentadiene novolak type epoxy resin; alicyclic epoxy resins; and the like. Further, it is possible to combiningly use an epoxy resin other than the above, in a certain amount or less, as required.

It is noted that, since the thermosetting resin is to seal semiconductor devices, it is preferable to decrease halogen ions such as chloride ions or alkali ions such as sodium ions in the resin. It is typically desirable for both types of ions to be each 10 ppm or less based on an extraction at 120° C. where 10 g of an applicable specimen is added into 50 ml of ion exchange water, which is then hermetically closed and left to stand still in an oven at 120° C. for 20 hours, followed by extraction by heating.

Exemplarily usable as a curing agent for the epoxy resin are: a phenol novolak resin; various amine derivatives; and substances each obtained by partially ring-opening an acid anhydride or acid anhydride group to thereby produce a carboxylic acid. Desirable among them is the phenol novolak resin so as to ensure reliability of semiconductor apparatuses.

To promote a reaction between the epoxy resin and the curing agent, it is possible to exemplarily use: an imidazole derivative; a phosphine derivative; an amine derivative; and a metal compound such as an organic aluminum compound. For example, it is preferable to mix the epoxy resin and the phenol novolak resin at such a ratio of 1:0.8 to 1.3 between the number of epoxy groups and the number of phenolic hydroxyl groups.

It is also possible to further blend various additives into the epoxy resin composition, as required. For example, for the purpose of improving properties of the resin, it is possible to additionally blend, into the composition, an additives) such as: a stress lowering agent such as various thermoplastic resins, thermoplastic elastomers, organic synthetic rubbers, silicone-based substances; waxes; halogen trapping agents; and the like.

Usable as the aforementioned silicone resin are condensable or heat-curable silicone resins, and the like. Desirable among them is a composition of an addition curable silicone resin. To be preferably used as such an addition curable silicone resin composition is one containing, as indispensable components: (A) an organopolysiloxane having a noncovalent double bonding group (alkenyl group such as vinyl group, for example); (B) organohydrogenpolysiloxane; and (C) a platinum-based catalyst.

Moreover, examples of the aforementioned silicone/epoxy hybrid resin include: a copolymer comprising the above-described epoxy resin and the above-described silicone resin; and the like.

It is possible to blend an inorganic filler into the composition of the epoxy resin, silicone resin, or silicone/epoxy hybrid resin, which composition is usable as the thermosetting resin. Examples of the inorganic filler to be blended include: silicas such as fused silica, crystalline silica, and the like; alumina; silicon nitride; aluminum nitride; alumino silicate; boron nitride; glass fibers; antimony trioxide; and the like. Although these inorganic fillers are not particularly limited in average particle diameter, shape, and the like, it is desirable for them to each have a maximum particle diameter of 75 μm or less, preferably 50 μm or less, in order to ensure the filling ability of the resin into such a narrow gap of 1 mm or less between large-sized substrates. Particularly, when the gap between substrates is 500 μm or less, the average diameter of the filler particles is to be 30 μm or less at the maximum, and such particles are to be suitably in spherical shapes, respectively. Adopting a filler of 75 μm or less enables to restrict deterioration of local flowability and to ensure a sufficient filling ability, thereby restricting occurrences of voids, unfilled spaces, and the like.

Particularly, as the inorganic filler to be blended into the epoxy resin composition, it is possible to adopt such an inorganic filler having been previously subjected to a surface treatment by a coupling agent such as a silane coupling agent, titanate coupling agent, or the like, so as to enhance a coupling strength between the epoxy resin and the inorganic filler.

As such a coupling agent, it is preferable to use: an epoxy functional alkoxysilanes such as γ-glycidoxypropyl-trimethoxysilane, γ-glycidoxypropyl-methyldiethoxysilane, β-(3,4-epoxycyclohexyl)ethyltrimethoxysilane, or the like; an amino functional alkoxysilane such as N-β-(aminoethyl)-γ-aminopropyl-trimethoxysilane, γ-aminopropyl-triethoxysilane, N-phenyl-γ-aminopropyl-trimethoxysilane, or the like; a mercapto functional alkoxysilane such as γ-mercaptopropyl-trimethoxysilane, or the like; or the like. It is noted that the coupling agent to be used for the surface treatment is not particularly limited in blending amount, surface treatment manner, and the like.

Also in case of the silicone resin composition, and the silicone/epoxy hybrid resin composition, it is possible to treat surfaces of particles of the inorganic filler by the coupling agent as noted above.

The inorganic filler is to be preferably filled in an amount between 20 and 1,300 parts by weight, particularly between 500 and 1,000 parts by weight, relative to a total of 20 parts by weight of the resin contained in the epoxy resin composition, silicone resin composition, or silicone/epoxy hybrid resin composition. Amounts of 100 parts by weight or more enable to obtain a sufficient strength, and amounts of 1,300 parts by weight or less scarcely cause deterioration of flowability due to thickening, thereby enabling to prevent a defective filling ability, in a manner to fully seal semiconductor devices arranged on the applicable substrate. It is preferable to contain the inorganic filler within a range between 15 and 95 wt %, particularly between 30 and 90 wt %, relative to the total weight of the composition.

[(E) Dicing]

According to the above steps, large substrates on which semiconductor devices are mounted, without producing void, and warp. The substrates integrated by the above method are taken out of the mold, and subjected to post-curing typically at a temperature between 150 and 180° C. for 1 to 4 hours, thereby enabling to stabilize its electric characteristics, and its mechanical characteristics.

Further, the integrated substrates after post-curing are diced by a dicing blade 12 in a normal manner to produce an individual semiconductor apparatus 20.

The semiconductor apparatus 20 produced by the above method for producing a semiconductor apparatus is a high-quality semiconductor apparatus restricted in its warp and its residual strains with excellent heat resistance and moisture resistance.

EXAMPLE

Hereinafter, the present invention will be more specifically described with reference to examples and a comparative example of the present invention. However, the present invention is not limited thereto.

Example 1

An organic resin substrate on which semiconductor devices were mounted and an organic resin substrate on which no semiconductor device was mounted, and a forming mold having a first cavity and a second cavity as shown in FIG. 1 were prepared.

Organic resin substrate on which semiconductor devices were mounted: a 300 μm×220 mm×240 mm BT resin substrate (linear expansion coefficient: 15 ppm/° C.). Capable of mounting at the maximum 40 silicon chips of 300 μm×12 mm×12 mm size. Obtained by adhering with an epoxy die bonding agent and removing 30 failed chips of 40 silicon chips bonded to a substrate with a gold wire.

Organic resin substrate on which no semiconductor device was mounted: a 100 μm×214 mm×234 mm BT resin substrate (linear expansion coefficient: 15 ppm/° C.).

A temperature of a forming mold of a compression molding machine was set at 150° C., the organic resin substrate on which semiconductor devices were mounted was attached on the upper mold by suction. On the other hand, the organic resin substrate on which no semiconductor device was mounted was similarly attached on the lower mold by suction. Further, 64 g of a thermosetting resin (KMC-2520, manufactured by Shin-Etsu Chemical Co., Ltd., specific gravity: 1.93) was stacked on the substrate attached to the lower mold.

An area around the mold was then sealed, and after the inside of the sealed area was depressurized by suction to a degree of vacuum of 5 kPa, upper and lower molds were closed. A gap between substrates was set to 600 μm. Subsequently, by applying pressure of 20 Kg/cm$^2$, the inside of the first cavity was filled with a resin and an excessive resin and voids were discharged via a runner to the second cavity. At this time, air was introduced in the second cavity so as not to decrease the pressure to the resin. A forming time was set to 3 minutes.

After molding, the resultant integrated substrate was taken out of the forming mold and cooled to room temperature. As a result of investigating the sealing layer, no fault was found, such as insufficient resin and generation of voids. When a warp of the substrate was measured, a warp amount in a longer direction was 0.1 mm and that in a shorter direction was 0.1 mm. Further, when the integrated substrate was post-cured at 180° C. for 4 hours and the warp was measured in a similar manner, a warp in a longer direction was 0.2 mm and that in a shorter direction was 0.1 mm, that is, almost free from warp.

The substrate was adhered to a dicing tape and diced to obtain 50 of individual semiconductor apparatuses, and on the back surface of each individual semiconductor apparatus, a solder ball was adhered to manufacture a semiconductor apparatus. As a result of electrically evaluating the individual semiconductor apparatuses, all functioned without problem.

When manufacture of the semiconductor apparatus was repeated 100 times and sealing layers were evaluated, a fault occurrence rate was 0%. On the other hand, in comparative example described below, a fault occurrence rate was 30%.

Thus, it was confirmed that, according to a method of manufacturing s semiconductor apparatus of the present invention, even when failed semiconductor devices are removed, without performing adjustment of a resin filling amount in accordance with the number of failed devices when a sealing layer is formed, a substrate and a sealing layer can be surely integrated, and, even when a large size substrate was sealed, the sealed substrate can be prevented from warping or cracking.

Example 2

A forming mold in which a first cavity and a second cavity were formed with the respective separate blocks as shown in FIG. 1F was prepared. In the prepared mold, temperatures of insides of the first and second cavities can be separately controlled. Temperatures in the first cavities of an upper mold and a lower mold were set to 150° and a temperature of the second cavity of the lower mold was set to 180°.

Except that air was not sent to the second cavity during pressing a resin, molding was performed according to the same molding method as that of example 1. As a result, no fault occurred, such as resin deficiency and void generation. Further, when a warp of the substrate was measured, an amount thereof was 0.1 mm in a longer direction and 0.1 mm in a shorter direction. Further, when a substrate was post cured at 180° C. for 4 hours and the warp was similarly measured, an amount thereof was 0.2 mm in a longer direction and 0.1 mm in a shorter direction, that is, a warp was hardly found.

The substrate was adhered to a dicing tape and diced to obtain 50 of individual semiconductor apparatuses, and on the back surface of each individual semiconductor apparatus, a solder ball was adhered to manufacture a semiconductor apparatus. As a result of electrically evaluating the individual semiconductor apparatuses, all functioned without problem.

When manufacture of the semiconductor apparatuses was repeated 100 times and sealing layers were evaluated, a fault occurrence rate was 0%.

Comparative Example

Compression molding upper and lower molds for mold clamping, which are not provided with a second cavity but are provided with only a first cavity were prepared. By using a semiconductor device mounting organic resin substrate from which 30 failed chips were removed in a manner the same as that of example 1, 52.64 g of a thermosetting epoxy resin (KMC-2520 manufactured by Shin-Etsu Chemical Co., Ltd., specific gravity: 1.93) was laminated on a lower substrate. The weighing step of the resin was very complicated and posed an impediment.

Under the conditions the same as that of example 1, semiconductor apparatuses were manufactured and evaluated similarly.

After the manufacture, sealing layers of the semiconductor apparatuses were investigated, and void generation was found. When, in a manner the same as that of example 1, manufacture of the semiconductor apparatus was repeated 100 times and the sealing layers were evaluated, a fault occurrence rate was 30%.

Further, in comparative example, since a filling amount of the resin was adjusted, in comparison with examples, a process time increased and an efficiency was poor.

It is to be noted that the present invention is not limited to the foregoing embodiment. The embodiment is just an exemplification, and any examples that have substantially the same feature and demonstrate the same functions and effects as those in the technical concept described in claims of the present invention are included in the technical scope of the present invention.

What is claimed is:

1. A method of manufacturing a semiconductor apparatus with a forming mold having an upper mold and a lower mold comprising:

a preparing step of preparing the forming mold having a first cavity for integrating a substrate on which a semiconductor device is mounted, a second cavity that is connected with the first cavity via a runner, a substrate on which no semiconductor device is mounted, and a sealing layer to be formed of a thermosetting resin between the substrates;

an arranging step of heating the first cavity to a temperature ranging from a room temperature to 200° C., disposing the substrate on which the semiconductor device is mounted on one of the upper mold and the lower mold of the forming mold, and disposing the substrate on which no semiconductor device is mounted on the other of the upper mold and the lower mold;

a charging step of charging the thermosetting resin in excess of an amount necessary for forming the sealing layer to fill the inside of the first cavity with the thermosetting resin and discharging an excess of the thermosetting resin from the first cavity into the second cavity;

an integrating step of integrating the substrate on which the semiconductor device is mounted, the substrate on which no semiconductor device is mounted and the sealing layer by molding the thermosetting resin while pressurizing the upper mold and the lower mold; and a dicing step of extracting the integrated substrates from the molding mold and dicing the integrated substrates to obtain an individual semiconductor apparatus.

2. The method of manufacturing a semiconductor apparatus according to claim 1, wherein, in the charging step, the thermosetting resin is charged in excess of the amount necessary to form the sealing layer by 0.1 to 70 volume percent of the amount necessary to form the sealing layer.

3. The method of manufacturing a semiconductor apparatus according to claim 1, wherein, in the integrating step, the inside of the first cavity or the inside of the second cavity is pressurized to mold the thermosetting resin.

4. The method of manufacturing a semiconductor apparatus according to claim 3, wherein the inside of the first cavity is pressurized by pressing air or an inert gas into the second cavity.

5. The method of manufacturing a semiconductor apparatus according to claim 4, wherein air or an inert gas is pressed into the second cavity by an external pump or a cylinder.

6. The method of manufacturing a semiconductor apparatus according to claim 3, wherein the inside of the first cavity is pressurized by injecting a liquefied thermosetting resin, a liquefied thermoplastic resin, or a liquid into the second cavity.

7. The method of manufacturing a semiconductor apparatus according to claim 6, wherein the liquefied thermosetting resin, the liquefied thermoplastic resin, or a liquid is injected into the second cavity by a cylinder.

8. The method of manufacturing a semiconductor apparatus according to claim 1, wherein, in the arranging step, the second cavity is heated to a temperature higher than a temperature of the first cavity, and in the charging step, the excess of the thermosetting resin discharged into the second cavity is cured before curing the thermosetting resin inside the first cavity.

9. The method of manufacturing a semiconductor apparatus according to claim 8, wherein the second cavity is heated to a temperature in the range of 100 to 250° C.

10. The method of manufacturing a semiconductor apparatus according to claim 1, wherein, in the integrating step, an atmosphere inside the first cavity is depressurized to mold the thermosetting resin.

11. The method of manufacturing a semiconductor apparatus according to claim 10, wherein an atmosphere inside the first cavity is depressurized to a degree of vacuum of 0.01333 to 13.33 KPa.

12. The method of manufacturing a semiconductor apparatus according to claim 1, wherein the thermosetting resin is molded by compression molding or by transfer molding.

13. The method of manufacturing a semiconductor apparatus according to claim 1, wherein as the thermosetting resin, any one of an epoxy resin, a silicone resin, and a silicone/epoxy hybrid resin is used.

* * * * *